United States Patent [19]

Butler et al.

[11] 3,740,591

[45] June 19, 1973

[54] BUCKET-BRIGADE TUNED SAMPLED DATA FILTER

[75] Inventors: Walter J. Butler; Charles M. Puckette, both of Scotia; Donald A. Smith, Schenectady, all of N.Y.

[73] Assignee: General Electric Company, Schenectady, N.Y.

[22] Filed: Feb. 25, 1972

[21] Appl. No.: 229,342

[52] U.S. Cl. .................................. 307/295

[51] Int. Cl. .................................. H03k 1/16

[58] Field of Search .................. 307/232, 233, 251, 307/295; 328/170, 167

[56] References Cited

UNITED STATES PATENTS 3,654,563 4/1972 Hesler .................. 307/295

3,676,711 7/1972 Ahrons .................. 307/255

3,471,711 10/1969 Poschenrieder .................. 307/233

3,546,490 12/1970 Sangster .................. 307/295

*Primary Examiner*—John W. Huckert

*Assistant Examiner*—R. E. Hart

*Attorney*—John F. Ahern, Julius J. Zaskalicky and Louis A. Moucha et al.

[57] ABSTRACT

A tuned filter circuit having response characteristics of a tuned LC circuit includes bucket-brigade delay lines and gain factor components connected in feedback circuit relationship around a summing amplifier, and in forward circuit relationship. The resonant frequency of the filter is primarily controlled by the frequency of a digital clock input to the bucket-brigade delay lines. The filter Q and the filter transient response are controlled by the gains established by the gain factor components.

29 Claims, 6 Drawing Figures

Patented June 19, 1973 3,740,591

4 Sheets-Sheet 2

BUCKET-BRIGADE TUNED SAMPLED DATA FILTER

Our invention relates to an electronically tuned filter circuit having a response equivalent to that of a conventional tuned inductor-capacitor circuit, and in particular, to an inductorless circuit utilizing bucket-brigade delay lines wherein the filter resonant frequency is controlled by the frequency of clock pulses applied to the bucket-brigade delay lines.

Conventional tuned filters often employ one or more inductor-capacitor networks, the value of whose elements are chosen to obtain a desired resonant frequency. HOwever, such networks tend to be bulky and expensive and the inductive elements generally have non-ideal characteristics whereby the filter performance leaves much to be desired. One approach for eliminating the need for inductors in tuned filters is a digital type filter known as a second-order digital resonator. Such digital filter, however, requires an analog-to-digital (A/D) converter and because of this, cannot readily be implemented in the form of a single monolithic integrated circuit. Further, the digital resonator is limited by a quantization noise generated during the A/D conversion process, by the conversion rate capabilities of the A/D converter, and by the logic speeds of multipliers utilized in such converters; and it requires one delay element per bit of digital input thereby adding considerable complexity to the filter circuit.

Therefore, one of the principal objects of our invention is to provide an inductorless circuit that is functionally equivalent to a tuned inductor-capacitor filter circuit.

Another object of our invention is to provide a filter circuit that is easily adjustable in both bandwidth (Q) and resonant frequency without undue circuit complexity.

A further object of our invention is to provide the filter circuit without the need for an analog-to-digital converter and capability of being implemented as a single monolithic integrated circuit.

In accordance with our invention, we provide a tuned, sampled data filter circuit having response characteristics of a conventional tuned inductor-capacitor filter and which utilizes at least two bucket-brigade delay lines (BBDLs). In a first embodiment, the analog input to the filter is applied directly to a first input of a summing amplifier and also through a first BBDL and gain factor $K_o$ component in forward circuit relationship to a second input. A second BBDL and gain factor $K_1$ component are connected in positive or negative feedback relationship, depending on the polarity of $K_1$, around the summer, and a third BBDL and gain factor $K_2$ component are connected in negative feedback relationship around the summer. In a second embodiment, the analog input to the filter is applied directly to a first input of a first of two summers and the output thereof connected to a first input of the second summer. A first BBDL and gain factor $K_1$ component are connected in positive or negative feedback relationship around the first summer, and a second BBDL and gain factor $K_2$ component are connected in negative feedback relationship around the first summer. A gain factor $K_o$ component is connected from the juncture of the two BBDLs to a second input of the second summer in forward circuit relationship. In both embodiments, the frequency of clock pulses applied to the BBDLs primarily controls the resonant frequency of the filter. The filter Q and the filter transient response are controlled by the predetermined gain values established by the gain factor components.

The features of our invention which we desire to protect herein are pointed out with particularity in the appended claims. The invention itself, however, both as to its organization and method of operation, together with further objects and advantages thereof may best be understood by reference to the following description taken in connection with the accompanying drawings wherein like parts in each of the several figures are identified by the same reference character and wherein:

Figures 1, 2:
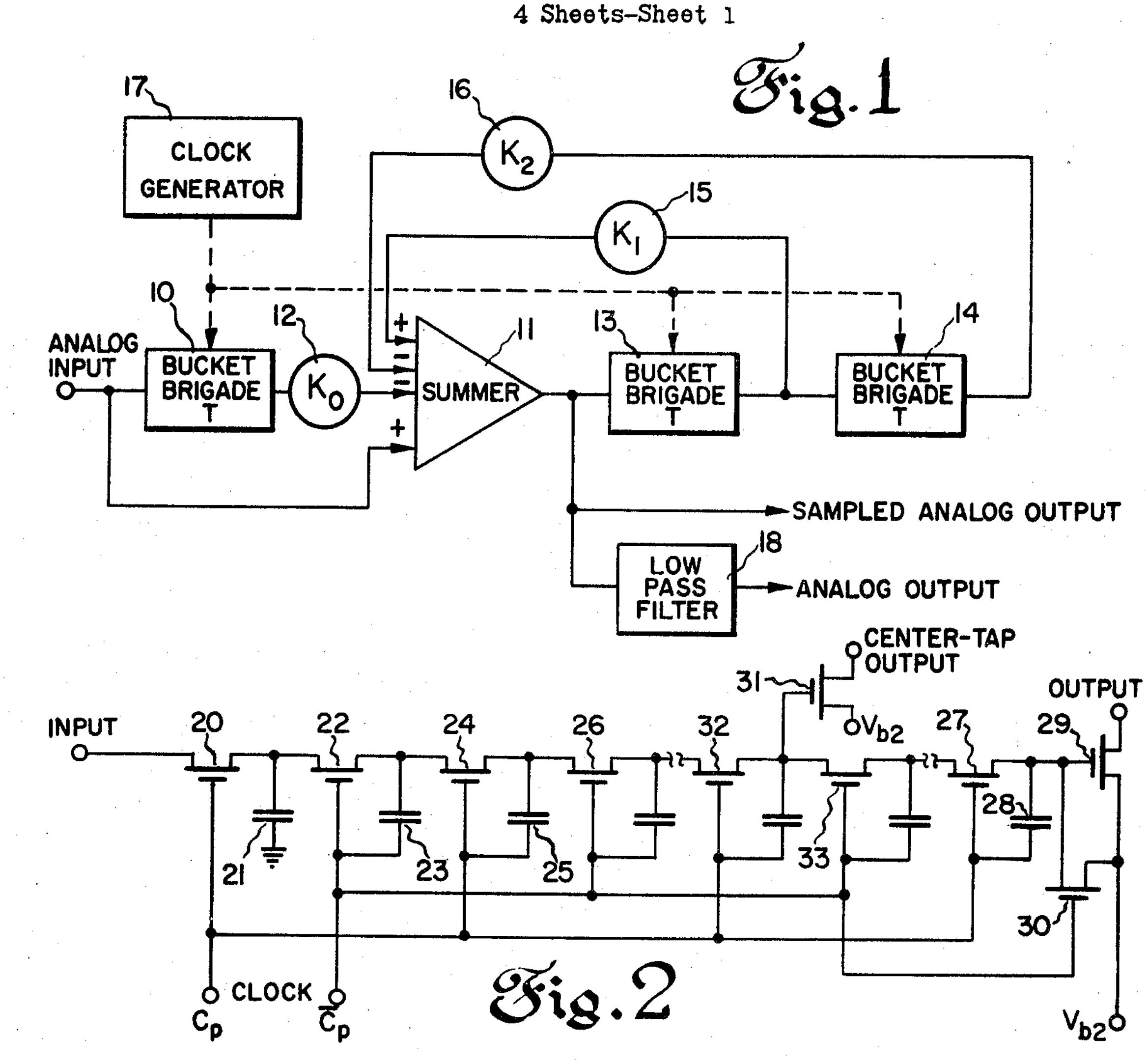
FIG. 1 is a block diagram of a first embodiment of our bucket-brigade tuned filter circuit.
FIG. 2 is a schematic representation of a bucket-brigade delay line utilized in our filter circuits.

Referring now in particular to FIG. 1, there is shown a first embodiment of our tuned, sampled data active filter, which for convenience will be described as the direct form. This direct form filter utilizes three bucket-brigade delay lines (BBDLs) and three gain factor components connected in various forward and feedback circuit relationships, to be described hereinafter, in accordance with the following difference equation:

$$y(nI) = K_1 y(nI-T) - K_2 y(nT-2T) + x(nT) - K_0 x(nT-T) \quad (1)$$

where $x(nT)$ represents an analog input signal to the filter which is sampled at $T_s$ intervals in a first of the BBDLs, $T$ is the time delay introduced by one of the BBDLs and is an integral number of sampling intervals $T_s$; $K_0$, $K_1$, $K_2$ are predetermined gain parameters established by the gain factor components, and $y(nT)$ represents the sampled analog output signal. The transfer characteristic of our tuned filter in z transform notation is:

$$H(2) = (Z^2 - K_0 Z)/(Z^2 - K_1 Z + K_2) \quad (2)$$

where $z = e^{Ts}$, and $s$ is the complex frequency. Stability conditions require that $K_2$ must always be positive and less than unity. For resonance to occur, $K_1^2/4$ must be less than $K_2$. Gain parameters $K_0$ and $K_1$ can be positive or negative, $K_0$ can be of any magnitude, and $K_1$ must be less than two.

The sampled output of our filter may be smoothed with a simple low pass filter whereby the smoothed output resembles that of a conventional bandpass filter with maximum output occurring at the resonant frequency, $f_0$, where $f_0$ is expressed as:

$$f_0 = \frac{1}{2\pi T} \mathrm{Cos}^{-1}\left(\frac{K_1}{2\sqrt{K_2}}\right) \quad (3)$$

The bandwidth $BW$ of our filter is conventionally defined as the frequency range between the half-power points of the output signal, and is expressed as:

$$BW = 1/\pi T \left| \ln \sqrt{K_2} \right| \quad (4)$$

The sharpness of the resonance, i.e., the $Q$ of our filter, is defined as the ratio of $f_0$ to $BW$ and is expressed as:

$$Q = \frac{\cos^{-1} \frac{K_1}{2\sqrt{K_2}}}{|\ln K_2|} \quad (5)$$

From the above equations, it can be noted that as the value of $K_2$ increases toward unity, the sharpness of the resonance increases, that is, the bandwidth BW decreases. From equation (3) it is evident that although the resonant frequency $f_0$ varies with $K_1$, and to a lesser extent with $K_2$, it is more effectively controlled by varying the frequency of digital clock pulses applied to the BBDLs and thereby changing $T$. Thus, for practical purposes, the resonant frequency $f_0$ of our filter is controlled by the frequency of a digital clock generator whereas the filter $Q$ and the filter transient response are controlled by the gain parameters $K_0$, $K_1$ and $K_2$.

Figure 4:
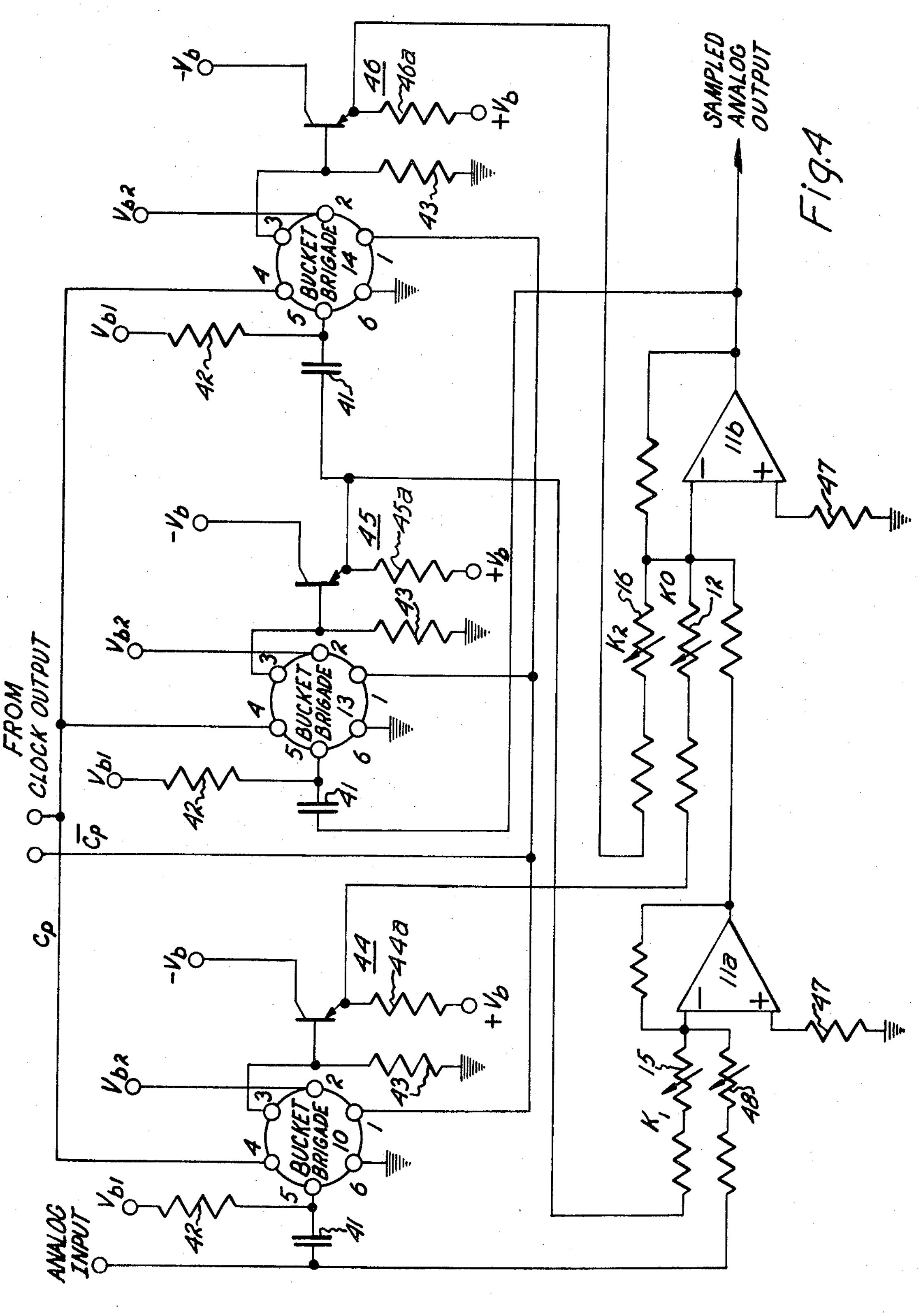
FIG. 4 is a schematic diagram of the bucket-brigade filter illustrated in block diagram form in FIG. 1.
Figure 5:
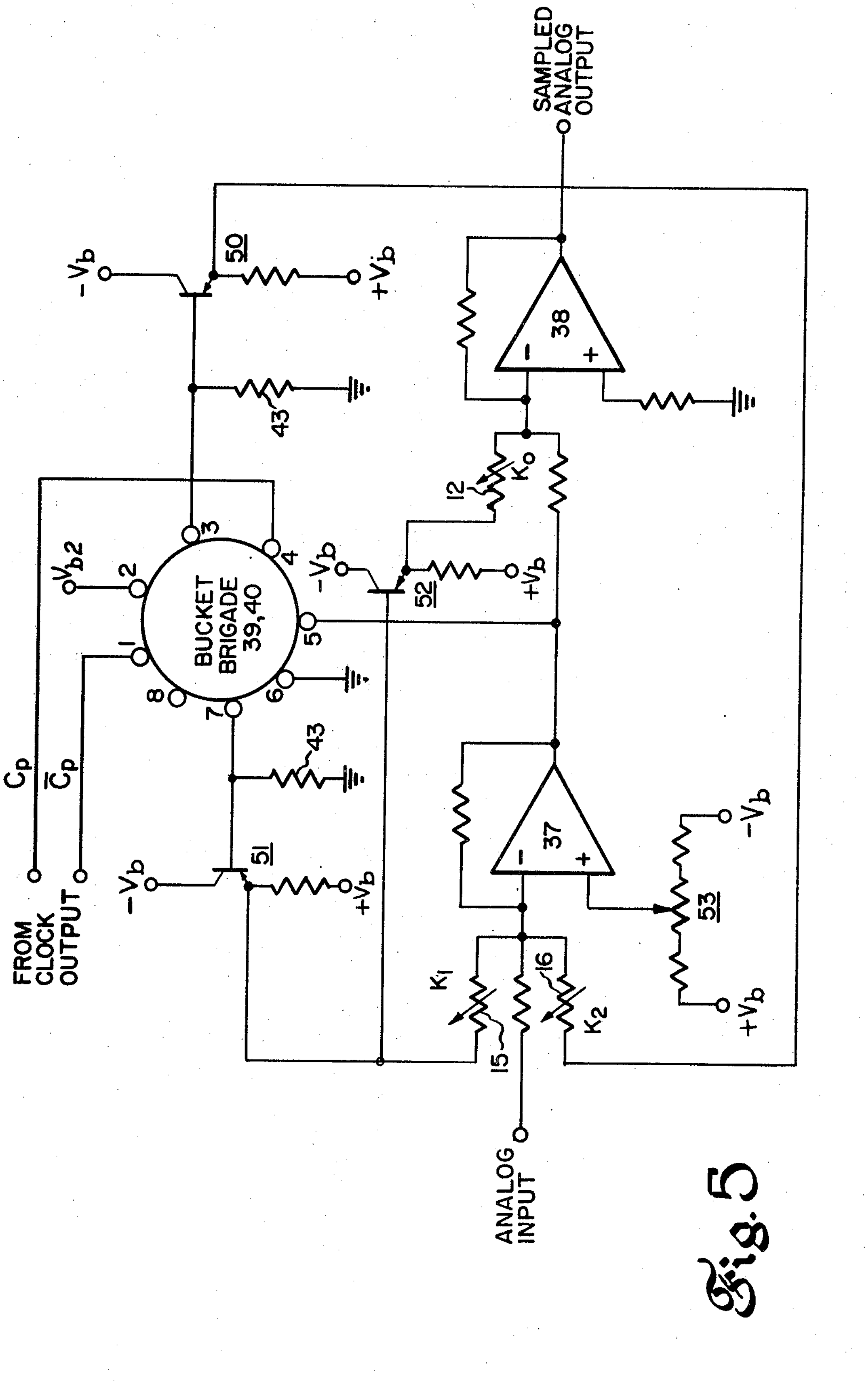
FIG. 5 is a schematic diagram of the bucket-brigade filter illustrated in block diagram form in FIG. 3.

The elements of the block diagram of FIG. 1 can now be more fully appreciated in view of the above equations which describe the characteristics of our BBDL sampled data filter circuit. Thus, in the direct form of our filter, the input analog signal is applied to the input of a first BBDL 10 as well as to the input of a conventional summing device, and specifically illustrated as being applied to a positive polarity input of a summing amplifier 11. Other type summing devices which may be utilized are a weighted resistor summing network which additionally might require a stage of fixed gain. Summer 11 is illustrated in FIGS. 4 and 5 as a conventional operational amplifier having a plurality of summing inputs. BBDL 10 samples the input signal at the sampling intervals $T_s$ which are controlled by a digital clock generator 17. BBDL 10 thus samples, holds and delays the input analog signal $x(nT)$ by a time $T$ which is an integral number of the sampling intervals, and as indicated by equation (3), the resonant frequency of our filter is primarily controlled by $T$. The output of BBDL 10 is connected to the input of a first gain factor component 12 designated $K_0$ and the output thereof is illustrated as being connected to a negative polarity input of summer 11. HOwever, since $K_0$ can be positive or negative, the polarity input connection to summer 11 determines which $K_1$ polarity is utilized. Thus, BBDL 10 and gain factor component 12 are connected in forward circuit relationship with respect to summer 11.

The output of summer 11 is connected to the input of a second BBDL 13 and the output thereof is connected to the input of a third BBDL 14. BBDLs 13 and 14 are both of the same time delay length $T$ as BBDL 10. At the juncture of BBDLs 13 and 14, a feedback is provided to an input of summer 11 through a second gain factor component 15 designated $K_1$. The particular polarity feedback of BBDL 13 and $K_1$ is illustrated in FIG. 1 as being a positive feedback, however, it should be obvious that this feedback can be made negative since $K_1$ can be positive or negative. The output of BBDL 14 is connected to the input of a gain factor component 16 designated $K_2$ and the output thereof connected to a negative polarity input of summer 11. The particular feedback of BBDL 14 and $K_2$ is always a negative feedback since $K_2$ is always positive. Thus, summer 11 is provided with the analog input signal as one input, the analog input signal operated on by a forward $K_0$ circuit as a second input, a first $K_1$ feedback which can be positive or negative, and a second $K_2$ negative feedback.

The bucket-brigade circuit provides a new means for realizing an electronically variable delay line which has many uses in analog signal processing. In our particular invention, the BBDL is utilized in a tuned sampled data filter circuit having electronically controlled response characteristics. The BBDL may be generally described as a series array of capacitors interconnected by suitable electronic switches which typically may be transistors of the bipolar, MOSFET or JFET type as three examples. The field effect transistor is preferred in the BBDL due to the base leakage current inherent in bipolar type transistors. Information can be stored in such array of capacitors and is propagated through the array at a rate determined by the (clock) rate at which the switches are sequentially opened and closed. The bucket-brigade circuit, therefore, provides a noninductive means for implementing an analog delay line, the delay period of which is controlled by an external clock, and recent advances in microelectronic technology permit implementation of our filter in single monolithic integrated circuit form.

A typical BBDL is illustrated in FIG. 2 and consists of an input sampling stage, a plurality of delay line stages, and an output source-follower stage. The input sampling stage of the BBDL consists of a first electronic switch, a MOSFET 20 in this particular illustration, having its source electrode connected to the input terminal of the filter, its gate electrode connected to a line $C_p$ supplied with square wave pulses generated by digital clock 17, and its drain electrode connected to a grounded capacitor 21 and to the source electrode of a MOSFET 22. The input signal sampling interval $T_s$ is thus controlled by the frequency of clock pulse $C_p$.

The plurality of delay line stages are formed by serially connected pairs of bucket-brigade stages. Each pair of bucket-brigade stages includes two serially connected electronic switches (MOSFETS illustrated herein) and a capacitor connected across the drain and gate electrodes of each transistor. The gate electrode of the first transistor is also connected to the complementary clock pulse line $\overline{C_p}$ whereas the gate electrode of the second transistor is also connected to clock pulse line $C_p$. Thus, capacitor 23 is connected across the drain and gate electrodes of transistor 22, the gate electrode of transistor 22 is connected to the $\overline{C_p}$ clock pulse line, and the drain electrode is connected to the source electrode of transistor 24 which together with capacitor 25 forms the second half of the first pair of delay line stages. Thus, capacitor 25 is connected across the drain and gate electrodes of transistor 24 and the gate electrode is also connected to the common clock pulse line $C_p$. The drain electrode of transistor switch 24 is connected to the source electrode of transistor 26 in the following pair of bucket-brigade stages. The second and all further pairs of bucket-brigade stages are serially connected in the same manner as the first stage. The number of pairs of bucket-brigade stages is determined primarily by the BBDL time delay, $T$, which is the primary control of the filter resonant frequency $F_0$.

The last bucket-brigade stage of the BBDL consists of transistor 27 and capacitor 28 connected across its drain and gate electrodes. The gate electrode of transistor 27 is also connected to the common $C_p$ clock pulse line, the source electrode is connected to the drain electrode of the previous bucket-brigade stage, and the drain electrode could comprise the output of the BBDL. However, for purposes of isolating the output of the BBDL, a source follower stage 29 is connected to the drain electrode of transistor 27, the source follower comprising a transistor having its gate electrode connected to the drain electrode of transistor 27, its drain electrode connected to a source of direct current bias voltage $V_{b2}$ and its source electrode being the output terminal of the BBDL. A transistor 30 having its source electrode connected to the drain electrode of transistor 27 and its drain electrode connected to the source of bias voltage $V_{b2}$ and its gate electrode connected to the common complementary clock pulse line $\overline{C_p}$ is utilized as a switching device for precharging the last capacitor 28 in the BBDL to a full charge, that is, transistor 30 permits filling the last "bucket" in accordance with conventional operation of BBDLs wherein the fullness of the buckets (the capacitive storage elements) proceeds from the last stage toward the first stage and the emptiness of such buckets, which contains the information (sampled analog input signal) to be propagated through the BBDL, proceeds from the first to the last stage. Thus, transistor 30 functions as a switch for providing (in conjunction with bias voltage $V_{b2}$) full charge of capacitor 28 prior to receiving an analog signal sample. The signal information is represented by the extent to which a full bucket is emptied, that is, the signal propagation through the BBDL from the input to the output ends is effected by means of a charge deficit transfer.

Although BBDLs 13 and 14 are illustrated in FIG. 1 as being two separate components, they may be fabricated as a single BBDL of time delay length $2T$ with a center-tap as illustrated in FIG. 2. A second source-follower stage consisting of transistor 31 has its gate electrode connected at the mid-point of the BBDL (assuming transistors 32 and 33 are in the centermost stages of the BBDL), the drain electrode is connected to the bias source $V_{b2}$ and the source electrode provides the output signal at the BBDL mid-point which is applied to gain factor $K_1$ component 15. The second half of the BBDL in FIG. 2 provides the function of BBDL 14 in FIG. 1.

The conventional two phase digital clock generator 17 supplies the square wave clock pulses to each of the three BBDLs 10, 13 and 14, that is, supplies the clock pulses $C_p$, $\overline{C_p}$, to the gate electrodes of the charge transfer transistors in the BBDLs. The clock generator is provided with a conventional means for varying the frequency of the clock pulses whereby the filter resonant frequency $f_0$ can be varied. The output of summer 11 is a sampled analog output signal in that the sample, hold and delay process which results in propagation of the BBDL input signal from stage to stage in the BBDLs results in a stepped or staircase type output waveform. A conventional simple low pass filter 18 may be connected to the output of summer 11 for smoothing out the irregularities in the sampled analog output signal and thereby develop what may be described as pure analog output signal. This smoothed output signal resembles the output of a conventional bandpass filter, having a maximum output occurring at the circuit resonant frequency, $f_0$. The gain factor components 12, 15 and 16 may each be variable resistors at the input to summer 11 whereby each gain is determined by conventional operational amplifier theory as the resistance ratio of a fixed feedback resistor (in operational amplifier 11) to the particular input resistor, and therefore gain factors $K_0$ and $K_1$ can readily be made greater than unity when necessary. Alternatively, the gain factor components can be other conventional electronically controlled circuits for providing variable gain such as a voltage controlled diode bridge circuit attenuator or a field effect transistor whose channel resistance between source and drain electrodes is controlled by a voltage applied to the gate electrode.

Figure 3:
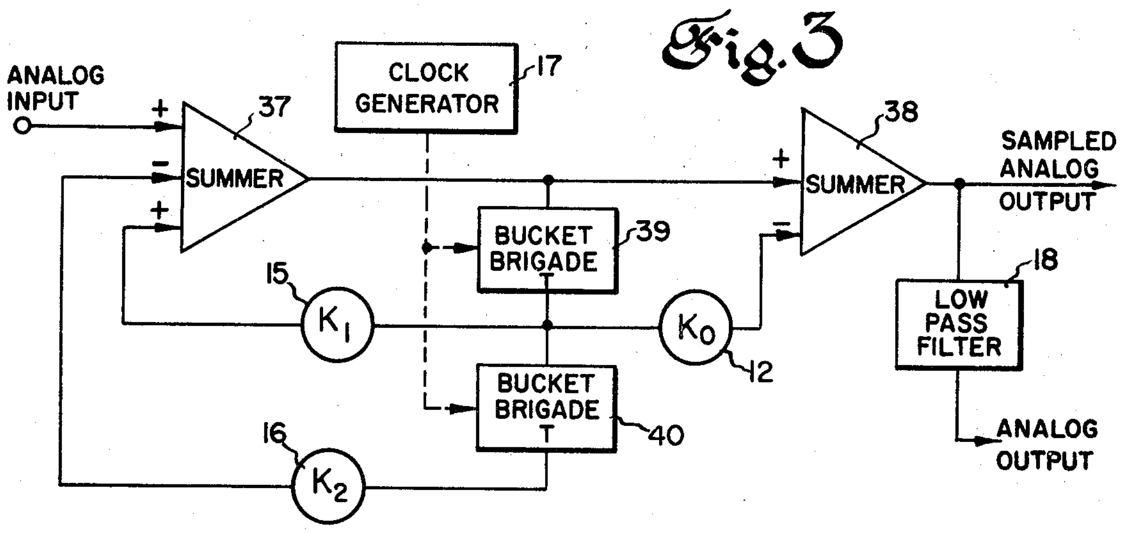
FIG. 3 is a block diagram of a second embodiment of our bucket-brigade tuned filter circuit.

A second embodiment of our BBDL tuned sampled data filter is illustrated in FIG. 3 and is described herein as being of canonic form in that it utilizes a minimum number of components as compared to the direct form embodiment in FIG. 1. The FIG. 3 embodiment also satisfies the difference equation (1) and the other equations (2) to (5) defining the various response characteristics also apply. The analog input signal is applied to a positive polarity input of a first summing amplifier 37 which may be of the same type as summing amplifier 11. The output of summer 37 is connected to a positive polarity input of a second summer 38. The output of summer 37 is also connected to the input of a first BBDL 39 whose output is connected to a second BBDL 40. BBDLs 39 and 40 each provide the same time delay $T$ and thus Both BBDLs may be fabricated as a single BBDL of total delay time $2T$ and be further provided with a center-tap output as illustrated in FIG. 2. The juncture of BBDLs 39 and 40, or alternatively, the center-tap of a BBDL of time delay $2T$, is connected to the input of a first gain factor component 12 again designated $K_0$ and is also connected to the input of a second gain factor component 15 designated $K_1$. The gain factor components may be any of the types of electronically controlled variable resistor or variable gain circuits described with reference to FIG. 1. The output of gain factor component 12 is connected in forward circuit relationship to a negative polarity input of summer 38 and the output of gain factor component 15 is connected in feedback circuit relationship to a positive polarity input of summer 37. The output of BBDL 40 is connected to the input of gain factor component 16 designated $K_2$ and the output thereof is connected in negative feedback circuit relationship to a negative polarity input of summer 37. As in the case of the FIG. 1 embodiment, $K_0$ and $K_1$ can be positive or negative as established by the polarity of the associated summer input. Thus, it is apparent that the circuit of FIG. 3 also utilizes the bucket-brigade delay lines and gain factor components connected in various forward and feedback circuit relationships in an equivalent manner to that of the FIG. 1 embodiment. As in the case of the FIG. 1 embodiment, the sampled analog output of summer 38 can be smoothed by means of a simple low pass filter 18 for obtaining a pure analog output signal wherein all of the frequencies of the input signal outside the bandwidth BW of our filter are rejected and only a narrow band centered about the filter resonant frequency $f_0$ appears in the output signal. Since the FIG. 3 embodiment utilizes only two BBDLs which can be fabricated as a single BBDL of double length, it is obvious that the FIG. 3 embodiment is of simpler and preferred form than that of FIG. 1 while providing the same function.

Referring now to FIG. 4, there is shown a schematic diagram of the details of the direct form of our BBDL tuned sampled data filter illustrated in block diagram in FIG. 1. Each of the BBDLs herein is represented by a large circle and at least six small circles representing pins or terminal connections to the BBDL. Thus, the BBDL input connection is at pin 5, the digital clock pulse line $C_p$ is connected to pin 1 and the complementary clock pulse line $\overline{C}_p$ is connected to pin 1. Pin 2 is connected to the bias voltage source $V_{b2}$ for precharging the last capacitor 28 in the BBDL, pin 3 is the output of the BBDL and pin 6 is indicated as being grounded and represents the substrate on which the BBDL is fabricated in monolithic integrated circuit form. The analog input signal to our BBDL filter is generally of an alternating type having both positive and negative polarity components and is supplied to the first BBDL 10 through a suitable coupling capacitor 41. Depending upon the type of substrate material utilized in the monolithic fabrication of the BBDL and the potential at which such substrate is maintained, the input signal may be biased with a positive or negative voltage. Thus, in the case wherein the substrate is of n-type material and maintained at ground potential, the analog input signal applied to the p-region forming the source electrode of the input sampling transistor 20 must always be a negative voltage and thus a resistor 42 is connected from the input terminal (pin 5) of BBDL 10 to a D.C. bias source $V_{b1}$ of negative voltage and the BBDL output bias $V_{b2}$ is also a negative voltage. In case such n-type substrate is maintained at a suitable positive potential, there may be no need for any type of bias at the input to the BBDL. In like manner, if the substrate is a p-type material and is maintained at ground potential, the analog input signal is biased from a source of positive voltage for insuring that the signal applied to the input n-region is always of positive polarity and the BBDL output bias voltage is also positive. The coupling capacitor 41 and input bias are also utilized at the inputs to the second and third BBDLs 13 and 14. The digital clock voltage pulses $C_p$ and $\overline{C}_p$ are of negative polarity for p-channel type transistors in the BBDLs, and are of positive polarity if the n-channel type transistors are utilized. The transistors in the BBDLs are all identical, as well as the storage capacitors therein.

A resistor 43 is connected from the output (pin 3) of each BBDL to ground, and the output voltage of each BBDL is developed across such resistor. The outputs of BBDLs 10, 13 and 14 are connected to the inputs (base electrodes) of emitter-follower circuits 44, 45 and 46, respectively, wherein such circuits provide isolation and impedance matching. Any voltage gain required to compensate for losses suffered in the source-follower stages in the output of the BBDLs and in the emitter-follower is incorporated in the variable resistors 12, 15 and 16. Each emitter-follower circuit may be a conventional transistor circuit, and as one example, is illustrated as including a bipolar transistor having its collector electrode connected to a negative D.C. voltage source $-V_b$ and its emitter electrode connected to a positive D.C. voltage source $+V_b$. The output of each emitter-follower is developed across the emitter resistor 44a and is applied to the input of an operational amplifier 11a or 11b which functions as the summing amplifier 11. Thus, the analog input signal is applied to an input of summer 11a through a resistor network consisting of a serially connected fixed resistor and variable resistor 48. The variable resistor 48 is utilized to decrease the input signal level at high Q and thereby prevent the filter output from being overdriven. In the specific embodiment illustrated in FIG. 4, the analog input signal is applied to a negative polarity input of summer 11a. The output of emitter-follower 45 is applied to a negative polarity input of summer 11a by means of a fixed resistor and variable resistor 15 which is used to vary the gain factor $K_1$ and compensate for any losses in the BBDL 13 source-follower stage and emitter-follower stage 45. The fixed resistor assures that a minimum resistance always exists in the input to prevent circuit instability. The output of emitter-follower 44 is applied to a negative polarity input of summer 11b by means of a fixed resistor and variable resistor 12 which is used to vary the gain factor $K_0$ and compensate for any losses in the BBDL 10 source-follower stage and emitter-follower stage 44. The output of emitter-follower 46 is applied to a negative polarity input of summer 11b by means of a fixed resistor and variable resistor 16 which is used to vary the gain factor $K_2$ and compensate for any losses in the BBDL 14 source-follower stage and emitter-follower stage 46. Thus, in accordance with conventional operational amplifer theory, each gain factor is determined by the resistance ratio of the amplifier feedback resistor to the input (fixed and variable) resistors. The output of summer 11a is also connected to a negative polarity input of summer 11b. The particular polarity inputs to summers 11a and 11b establish $K_0$ as being a negative value and $K_1$ as being positive. Resistors 47 connected between the positive polarity inputs of summers 11a, 11b and ground minimize any D.C. offset voltage at the summer outputs.

FIG. 5 illustrates a schematic diagram of our BBDL tuned sampled data filter shown in block diagram form in FIG. 3. The FIG. 5 diagram is illustrated in a somewhat simplified form with respect to the FIG. 4 diagram, it being understood that the FIG. 5 circuit would also include the combination of both a fixed and variable resistor in the signal inputs to summers 37 and 38 as illustrated in the FIG. 4 embodiment. The variable resistors 12, 15 and 16 in the inputs to summers 37 and 38 are respectively used to vary the gain factors $K_0$, $K_1$ and $K_2$ (as well as to compensate for any losses in the BBDL source-follower stages and emitter-follower stages as in the FIG. 4 embodiment. HOwever, in the FIG. 5 embodiment, the gain factor $K_2$ is established in the first summer 37 as distinguished from the FIG. 4 embodiment. The use of a single center-tapped BBDL (39, 40) of time delay length $2T$ simplifies the FIG. 5 circuit compared to the FIG. 4 circuit. Obviously, BBDLs 13 and 14 can be formed as a single center-tapped BBDL to thereby simplify the FIG. 4 embodiment. In the FIG. 5 embodiment, a first emitter-follower circuit 50 is connected between the final output (pin 3) of the BBDL and variable resistor 16 for isolation purposes to prevent loading of the summer 37 input. In like manner, a second emitter-follower circuit 51 is connected between the center-tap output (pin 7) of the BBDL and variable resistor 15. A third emitter-follower circuit 52 provides isolation between variable resistors 12 and 15 as well as isolation of the input to summer 38. A D.C. bias network 53 includes fixed and variable resistors serially connected across a D.C. voltage supply $\pm V_b$. The output of bias network 53 is connected to a positive polarity input of summer 37 to provide the desired bias at the BBDL input. The particular polarity inputs to summers 37 and 38 establish $K_0$ as being a positive value and $K_1$ as being negative.

Although two summing amplifiers are illustrated as being utilized in the FIGS. 4 and 5 embodiments of our filter, it should be understood that in the FIG. 4 embodiment this was necessitated by the number of available inputs of the desired polarity in the operational amplifier device. In the more general case wherein the summing devices are other type devices such as the aforementioned weighted resistor summing network, with or without an additional stage of fixed gain, or an operational amplifier provided with more inputs than presently conventionally available, only one such summing device is required in the FIG. 4 embodiment.

In both the FIGS. 4 and 5 embodiments of our filter, the resonant frequency $f_0$ is primarily controlled by the BBDL time delay, $T$, which is, of course, dependent on the frequency of the clock pulses. In like manner, the filter Q is primarily a function of the gain factor $K_2$. Since the clock frequency and the gain parameters $K_0$, $K_1$ and $K_2$ may each be electronically controlled, the entire filter circuit may be fabricated in monolithic integrated circuit form with separate electronic control of the filter resonant frequency and bandwidth (Q). This capability of separate electronic control of the filter parameters allows our filter to be programmable as to such separate controls whereby the filter characteristics may easily and automatically be changed to pass any desired predetermined range of input frequencies. Thus, the center resonant frequency $f_0$ can easily be scanned over a range of frequencies, for example, by varying the clock frequency for spectrum analysis purposes. Further, the BBDLs provide a precise time delay $T$ due to the ability to generate clock pulses of precise frequency, and therefore our filter can be precisely tuned to a predetermined resonant frequency.

The above features render our filter circuit an ideal building block for the synthesis of more complex filters. Thus, our BBDL single tuned filter has wider application than merely that of a bandpass filter. Our BBDL filter has the advantage over the digital filter known as the second-order digital resonator in that it is compatible with analog signals and therefore does not suffer from limitations imposed by analog-to-digital converters which are necessarily used in such second-order digital resonator with an analog signal input.

As an example of the parameter values associated with our BBDL, a 20 stage bucket-brigade circuit tapped at its mid-point by means of a source-follower and implemented in monolithic integrated circuit form using conventional MOS processing has the following integrated circuit parameters:

| | |
|---|---|
| Substrate Resistivity | 1–10 Ω cm |
| Field Oxide | 1 micron |
| Gate Oxide | 1400–1500 A. |
| Junction Depth | 3 micron |
| Sheet Resistance of Drain Region | 150 Ω/ square |
| Channel Width to Length Ratio | 12:1 |
| Storage Site Area (Including Channel) | 7.5 sq. mils |

Figure 6:
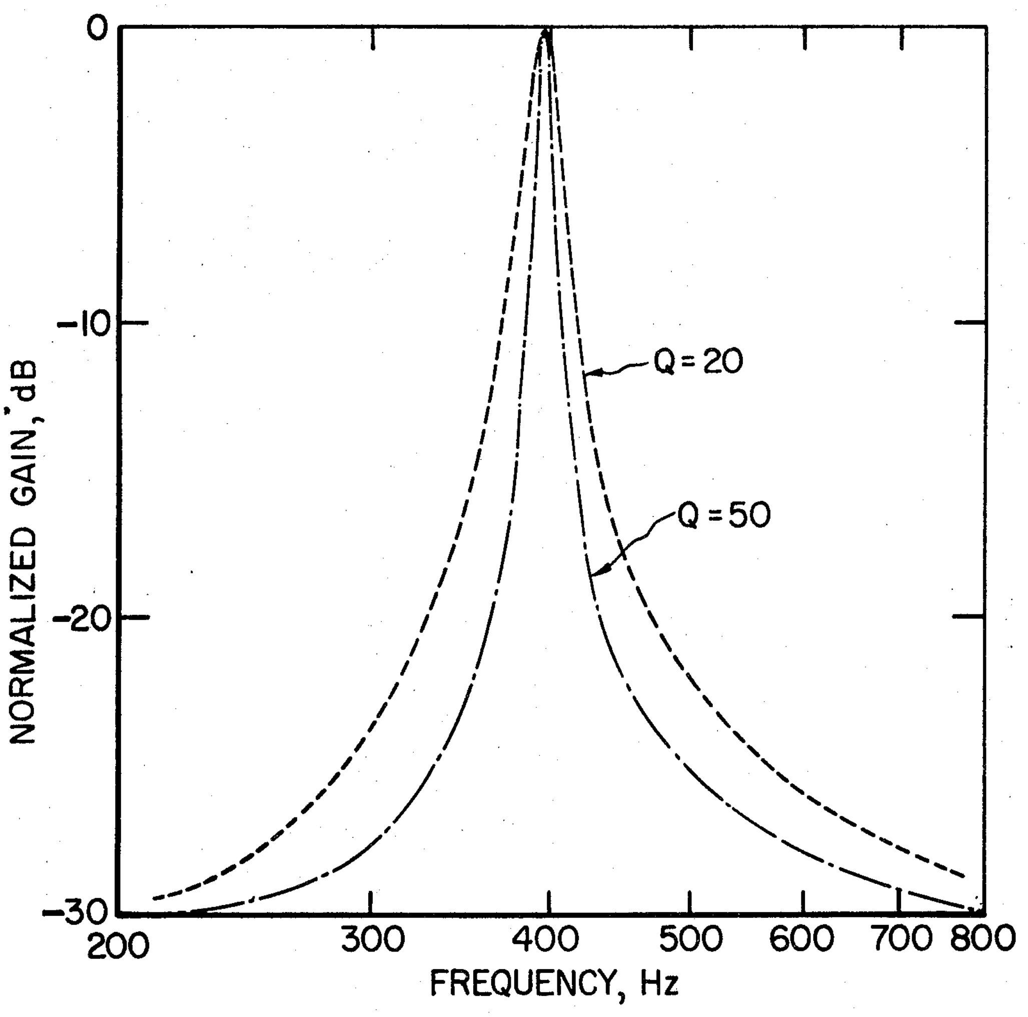
FIG. 6 is a graphical representation of the frequency response of the filter circuit illustrated in FIGS. 1 and 3.

This BBDL was operated successfully at clocking frequencies from 3 hertz (Hz) to 20 MHz. The 20-stage BBDL in the FIG. 5 circuit was used to obtain the typical response curves shown in FIG. 6 wherein the resonant frequency $f_0$ is 400 Hz and curves for constant $Q = 20$ and 50 are illustrated. These particular curves were obtained by operating the circuit with a clock frequency of 10 KHz. $Q$'s ranging from 2 to 200 were obtained by varying the gain parameter $K_2$ in accordance with equation (5). Measurements were also made for determining the dependence of the circuit $Q$ on the gain parameter $K_2$ for a fixed value of gain parameter $K_1 = 0.7$, the results indicating that $Q$ varies nonlinearly from a value of approximately four at a gain $K_2$ 32 0.6 to a value of approximately 200 at a gain $K_2$ of approximately 0.99. Measurements for determining the dependence of the resonant frequency $f_0$ on the gain parameter $K_1$ indicate that the frequency varies linearly from approximately 290 Hz at a gain $K_1$ of $\pm1.2$ to approximately 760 Hz at a gain $K_1$ of approximately $-1.4$. Measurements also indicate that the resonant frequency remains relatively constant with variations of gain $K_2$ for a fixed value of gain $K_1$, and thus $f_0$ is relatively insensitive to changes in gain $K_2$. Finally, measurements were made to determine the dependence of the resonant frequency $f_0$ on the clock frequency for fixed gain parameters of $K_1 = 1.0$ and $K_2 = 0.94$. The measurements indicate a linear variation of the resonant frequency with clock frequency from a resonant frequency of approximately 140 Hz at a clock frequency of 3 KHz to a resonant frequency of 20 KHz at a clock frequency of 600 KHz. Thus, the resonant frequency of the filter is directly related to the bucket-brigade clock frequency.

From the foregoing, it can be appreciated that the objectives set forth have been met and that our invention provides a single tuned active band-pass sampled-data filter which requires no inductive element and yet is functionally equivalent to a tuned inductor-capacitor filter circuit. Our filter is a relatively simple circuit and is easily and separately adjustable as to bandwidth ($Q$) and resonant frequency, the gains $K_0$, $K_1$, $K_2$ and the summing being implemented with operational amplifiers in the illustrated embodiments. Finally, since our filter does not require an analog-to-digital converter, the circuit is readily capable of being implemented in monolithic integrated circuit form. Although two specific embodiments of our filter have been described hereinabove, it is to be understood that various other types of conventional circuits may be utilized for implementing the weighting (variable gain factor) and summing functions, for isolating the inputs to the summing amplifiers and for obtaining various bias levels. Thus, it is to be understood that modifications may be made without departing from the intended scope of our invention as defined by the following claims.

What we claim as new and desire to secure by Letters Patent of the United States is:

1. A tuned band-pass sampled data filter comprising:
summing means provided with input and output terminals, a first of said summing means input terminals adapted to be supplied with an analog input signal to be processed by said filter,
first bucket-brigade delay line and gain factor means serially connected in forward circuit relationship with respect to said summing means,
second bucket-brigade delay line and gain factor means serially connected in feedback circuit relationship with respect to said summing means, third bucket-brigade delay line and gain factor means serially connected in negative feedback circuit relationship with respect to said summing means, and digital clock means for generating a square wave voltage waveform and complementary waveform applied to a pair of input clock terminals associated with the bucket-brigade delay lines of said bucket-brigade delay line and gain factor means for causing signals appearing at input signal terminals thereof to be sampled, held and delayed in their propagation therethrough, the processed signal appearing at a first output terminal of said summing means being a sampled data analog signal with maximum amplitude centered at the filter resonant frequency $f_0 = 1/2\pi\ T^{\cos^{-1}}(K_1/2\ \sqrt{K_2})$ and having a bandwidth $BW = 1/\pi T\ |\ln\ \sqrt{K_2}|$ where $T$ is the delay time of one of the bucket-brigade delay line, and $K_1$ and $K_2$ are predetermined gains established by the gain factor of said second and third bucket-brigade delay line and gain factor means, respectively.

2. The filter set forth in claim 1 wherein:

$K_1^2/4$ must be less than $K_2$ in order to obtain resonance in the filter.

3. The filter set forth in claim 1 wherein:

$K_2$ must be positive and less than unity in order to obtain stable operation of the filter.

4. The filter set forth in claim 1 wherein:

$K_0$ and $K_1$ can be positive or negative where $K_0$ is a predetermined gain established by said first gain factor means.

5. The filter set forth in claim 4 wherein:

$K_0$ can be of any magnitude.

6. The filter set forth in claim 1 wherein:

$K_1$ must be less than two.

7. The filter set forth in claim 1 wherein:

the bandwidth of the filter is varied primarily by changing $K_2$, and the filter resonant frequency $f_0$ is varied primarily by changing the frequency of the digital clock means square waves which determine the bucket-brigade delay line time $T$, the clock frequency and gain $K_2$ being separately adjustable.

8. The filter set forth in claim 1 wherein:

said summing means includes two summing amplifiers connected in series circuit relationship.

9. The filter set forth in claim 1 wherein:

said summing means is a single electrical signal summing device.

10. The filter set forth in claim 1 wherein:

said first, second and third bucket-brigade delay line means are three separate bucket-brigade delay lines.

11. The filter set forth in claim 10 wherein:

said first, second and third bucket-brigade delay lines are of equal length to thereby provide equal time delays $T$.

12. The filter set forth in claim 1 wherein:

said first bucket-brigade delay line means is a separate bucket-brigade delay line and said second and third bucket-brigade delay line means are formed as a single bucket-brigade delay line of delay time $2T$ and provided with a center-tap to provide a second output of delay time $T$.

13. The filter set forth in claim 1 wherein:

said first, second and third bucket-brigade delay line means are formed as a single bucket-brigade delay line of delay time $2T$ and provided with a center-tap to provide a second output of delay time $T$, said first and second gain factor means commonly connected to an output terminal at the center-tap of the single bucket-brigade delay line, said third gain factor means connected to the $2T$ output terminal thereof.

14. The filter set forth in claim 1 wherein:

said summing means consists of first and second serially connected summing amplifiers, an input terminal of said first summing amplifier being supplied with the analog input signal to be processed, an output terminal of said second summing amplifier providing the output sampled data analog signal.

15. The filter set forth in claim 14 wherein:

said first bucket-brigade delay line and gain factor means consists of a first bucket-brigade delay line of delay time $T$ and a first variable resistor connected in series circuit relationship, the analog input signal to be processed being supplied to the input signal terminal of said first bucket-brigade delay line, an output of said first variable resistor connected to an input terminal of a selected of said first and second summing amplifiers as determined by the polarity of a predetermined gain $K_0$ established by said first variable resistor.

16. The filter set forth in claim 15 wherein:

said second bucket-brigade delay line and gain factor means consists of a second bucket-brigade delay line of delay time $T$ and a second variable resistor which establishes the predetermined gain $K_1$ connected in series circuit relationship, the input signal terminal of said second bucket-brigade delay line connected to the output terminal of said second summing amplifier, an output of said second variable resistor connected to an input terminal of a selected of said first and second summing amplifiers as determined by the polarity of the predetermined gain $K_1$.

17. The filter set forth in claim 16 wherein:

said third bucket-brigade delay line and gain factor means consists of a third bucket-brigade delay line of delay time $T$ and a third variable resistor which establishes the prdetermined gain $K_2$ connected in series circuit relationship, the input signal terminal of said third bucket-brigade line connected to an output terminal of said second bucket-brigade line, an output of said third variable resistor connected to an input terminal of said second summing amplifier to establish the negative feedback relationship.

18. The filter set forth in claim 15 wherein:

said third bucket-brigade delay line and gain factor means consists of a second bucket-brigade delay line of delay time $2T$ and a third variable resistor which establishes the predetermined gain $K_2$ connected in series circuit relationship, the input signal terminal of said second bucket-brigade delay line connected to the output terminal of said second summing amplifier, an output of said third variable resistor connected to an input terminal of said second amplifier, and said second bucket-brigade delay line provided with a center-tap to provide a second output of delay time $T$, said second bucket-brigade delay line and gain factor means consists of a second variable resistor which establishes the predetermined gain $K_1$ connected in series circuit relationship with said second bucket-brigade delay line at the center-tap thereof, an output of said second variable resistor connected to an input terminal of a selected of said first and second summing amplifiers as determined by the polarity of the predetermined gain $K_1$.

19. The filter set forth in claim 14 wherein:

said first bucket-brigade delay line and gain factor means consists of a bucket-brigade delay line of delay time $2T$ and provided with a center-tap to provide a second output of delay time $T$ and a first variable resistor which establishes a predetermined gain $K_0$ connected in series circuit relationship with said bucket-brigade delay line at the center-tap output thereof, the input signal terminal of said bucket-brigade delay line connected to the output terminal of said first summing amplifier, an output of said first variable resistor connected to an input terminal of said second summing amplifier determined by the polarity of the predetermined gain $K_0$.

20. The filter set forth in claim 19 wherein:

said second bucket-brigade delay line and gain factor means consists of said bucket-brigade delay line of delay time $2T$ and a second variable resistor which establishes the predetermined gain $K_1$ connected in series circuit relationship with said bucket-brigade delay line at the center-tap output thereof, an output of said second variable resistor connected to an input terminal of said first summing amplifier determined by the polarity of the predetermined gain $K_1$.

21. The filter set forth in claim 20 wherein:

said third bucket-brigade delay line and gain factor means consists of said bucket-brigade delay line of delay time $2T$ and a third variable resistor which establishes the predetermined gain $K_2$ connected in series circuit relationship with said bucket-brigade delay line at the $2T$ output thereof, an output of said third variable resistor connected to an input terminal of said first summing amplifier to establish the negative feedback relationship.

22. The filter set forth in claim 21 wherein:

said summing amplifiers are electronic operational amplifiers provided with a plurality of summing inputs, the magnitude of the predetermined gains $K_0$, $K_1$ and $K_2$ being determined by the ratio of resistances of the operational amplifier feedback resistor to that of the resistors in the summing inputs containing the first, second and third variable resistors, respectively.

23. The filter set forth in claim 22 and further comprising:

means connected between the outputs of said bucket-brigade delay line and the variable resistors for providing isolation and impedance matching therebetween.

24. The filter set forth in claim 22 and further comprising:

means connected at an input of said second operational amplifier for reducing any D.C. offset voltage at the output thereof.

25. The filter set forth in claim 22 and further comprising:

means in communication with the input signal terminal of said bucket-brigade delay line for providing a desired bias voltage thereto for assuring the input signal thereto is of unipolarity.

26. The filter set forth in claim 19 wherein:

said bucket-brigade delay line comprises an input sampling stage and a plurality of serially connected delay line stages, the input sampling stage consisting of an electronic switch and a capacitor. each delay line stage consisting of a pair of electronic switches and capacitors.

27. The filter set forth in claim 26 wherein:

the electronic switches each consist of a field effect transistor, the capacitor in the sampling stage connected between the drain electrode of the transistor and ground, the capacitors in the delay line stages connected between the drain and gate electrodes of the respective transistors.

28. The filter set forth in claim 26 wherein:

the square wave voltage waveform generated in said digital clock means is applied to the gate electrodes of the transistor in said input sampling stage and the second and alternate transistors in said delay line stages, the complementary waveform generated in said digital clock means is applied to the gate electrodes of the first and alternate transistors in said delay line stages.

29. The filter set forth in claim 26 wherein:

said bucket-brigade delay line further comprises a first output source-follower stage connected at the center-tap output thereof, and a second output source-follower stage connected at the $2T$ output thereof.

* * * * *